United States Patent [19]

Nakamura et al.

[11] Patent Number: 4,543,293

[45] Date of Patent: Sep. 24, 1985

[54] POLARIZED, SHAPED MATERIAL OF COPOLYMER OF VINYLIDENE FLUORIDE

[75] Inventors: Ken'ichi Nakamura; Teruo Sakagami; Yoshikichi Teramoto; Hiroshi Obara, all of Iwaki, Japan

[73] Assignee: Kureha Kagaku Kogyo Kabushiki Kaisha, Tokyo, Japan

[21] Appl. No.: 496,472

[22] Filed: May 20, 1983

[30] Foreign Application Priority Data

May 28, 1982 [JP] Japan .................................. 57-90600

[51] Int. Cl.$^4$ ...................... H01L 41/18; H01L 41/20
[52] U.S. Cl. ........................................ 428/421; 156/17; 156/229; 156/244.11; 310/311; 310/313 A; 310/357; 310/800; 428/543; 428/913
[58] Field of Search .................... 310/800, 311, 313 A, 310/357; 428/421, 543, 913; 156/229, 244.17; 264/22

[56] References Cited

U.S. PATENT DOCUMENTS 3,798,473  3/1974  Murayama et al. .
4,204,135  5/1980  Murayama .
4,302,408  11/1981  Ichihara ................ 264/22

FOREIGN PATENT DOCUMENTS 37877   10/1981  European Pat. Off. .
1383980  9/1981  Japan .
1515799  6/1978  United Kingdom .

Primary Examiner—James C. Cannon
Attorney, Agent, or Firm—Lyon & Lyon

[57] ABSTRACT

Disclosed is a polarized, shaped material comprising a copolymer of 40 to 87 mol % of vinylidene fluoride, 10 to 40 mol % of trifluoroethylene and 3 to 20 mol % of vinyl fluoride.

8 Claims, 2 Drawing Figures

POLARIZED, SHAPED MATERIAL OF COPOLYMER OF VINYLIDENE FLUORIDE

BACKGROUND OF THE INVENTION

The present invention relates to a piezoelectric polymer material having a high piezoelectric performance even at a frequency in a high frequency range, and more particularly, a polarized, shaped bodies comprising a copolymer of vinylidene fluoride for use as elements in an ultrasonic transducer, the ultrasonic transducer provided with the elements being superior to the conventional ultrasonic transducer provided with conventional elements in sensitivity of transmitting and receiving ultrasonic waves.

As a piezoelectric polymer substance, for instance, poly(vinylidene fluoride) and a copolymer of vinylidene fluoride have been reported, respectively in Japanese Patent Publications Nos. 45-83771 (1970) and 50-29159 (1975), and it has been reported in Japanese Patent Publication No. 51-23439 (1976) that these polymer and copolymer have a piezoelectric performance even at a frequency in a high frequency region.

Furthermore, in Japanese Patent Application Laying Open No. 53-26995 (1978), it has been disclosed that a binary copolymer of vinylidene fluoride and trifluoroethylene is a piezoelectric polymer material.

Among these fluoropolymers, poly(vinylidene fluoride) has been considered to be the most useful piezoelectric polymer material for use as elements in an ultrasonic transducer because in the case where a stress or an electric field is loaded onto the shaped body in the direction parallel to the direction of polarization, the electromechanical coupling factor ($k_t$) being 0.20 and of the processability to shaped bodies being favorable. However, a further improvement of its performance has been demanded with the requirement for higher sensitivity of the transducer.

A higher electromechanical coupling factor ($k_t$) can be obtained in a binary copolymer of vinylidene fluoride, particularly in a copolymer of 75 mol % of vinylidene fluoride and 25 mol % of trifluoroethylene. However, in the case where the binary copolymer is subjected to shaping into elements having a concave for improving the ultrasonic sensitivity of the transducer, cracks are frequently formed in the shaped elements to remarkably reduce the production yield of the elements. In addition, a large improvement of the ultrasonic sensitivity of the transducer provided with the thus prepared element corresponding to the large value of $k_t$ thereof was not obtained.

The object of the present invention is to provide a piezoelectric polymer material giving a high yield in preparing shaped elements therefrom for use in an ultrasonic transducer and giving a high ultrasonic sensitivity to the ultrasonic transducer provided with the thus prepared element.

As a result of studying and examining various copolymers derived from vinylidene fluoride, the present inventors have found that a copolymer of vinylidene fluoride, trifluoroethylene and vinyl fluoride shows a high yield in preparing elements for the ultrasonic transducer therefrom and a high electromechanical coupling factor ($k_t$) and gives a high sensitivity to the ultrasonic transducer provided with the thus prepared element, and have attained the present invention.

SUMMARY OF THE INVENTION

In the first aspect of the present invention, there is provided polarized, shaped bodies comprising a copolymer of 40 to 87 mol % of vinylidene fluoride, 10 to 40 mol % of trifluoroethylene and 3 to 20 mol % of vinyl fluoride.

In the second aspect of the present invention, there is provided a method for preparing the polarized, shaped bodies comprising subjecting shaped bodies of copolymer of 40 to 87 mol % of vinylidene fluoride, 10 to 40 mol % of trifluoroethylene and 3 to 20 mol % of vinyl fluoride to polarization after or while subjecting the copolymer to a thermal treatment at a temperature between the temperature which subtracts 5° C. from the crystalline secondary transition temperature ($T_c$° C.) thereof and the melting temperature ($T_m$° C.) thereof.

DETAILED DESCRIPTION OF THE INVENTION

Figure 1:
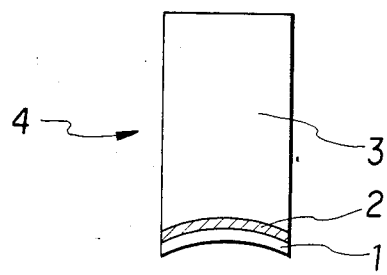
FIG. 1 shows a longitudinal cross section of an ultrasonic transducer provided with an element comprising the polarized, shaped body, of which the ultrasonic sensitivity is to be measured.

The present invention relates to polarized, shaped material showing an electromechanical coupling factor ($k_t$) of larger than 0.21 and comprising a copolymer of 40 to 87 mol %, preferably 65 to 80 mol % of vinylidene fluoride, 10 to 40 mol %, preferably 15 to 30 mol % of trifluoroethylene and 3 to 20 mol %, preferably 5 to 15 mol % of vinyl fluoride.

Although the terpolymer in the copolymer of the polarized shaped bodies according to the present invention is desirable, a small amount of one or more than one fluorine-containing monomers such as tetrafluoroethylene, hexafluoropropylene, monocholorotrifluoroethylene, etc. may be added as the monomeric component(s). In any case, wherein, at any rate, the respective amounts of vinylidene fluoride, trifluoroethylene and vinyl fluoride are out of the above-mentioned respective ranges, the value of $k_t$ of the element prepared by the copolymer becomes smaller than 0.20 thereby causing the reduction of the sensitivity of the ultrasonic transducer to which the polarized body of such a copolymer is applied, or the softness of the original copolymer is lost. Accordingly, the monomeric composition of the copolymer must be in the range shown above. As the shaped body, for instance, films and tubes may be mentioned as the representatives thereof, and in addition, concave films are preferably used to flat films because of the better sensitivity of the former.

The polarized, shaped bodies are prepared by known methods, i.e., that for polymerizing vinylidene fluoride et al, that for molding the thus produced copolymer of vinylidene fluoride into shaped articles and that for subjecting the thus shaped bodies of the copolymer of vinylidene fluoride to polarization. It is desirable to thermally treat the shaped bodies according to the present invention thereby improving the electromechanical coupling factor ($k_t$) before or during subjecting the shaped body to the treatment for polarizing at a temperature between the temperature which subtracts 5° C. from the crystalline secondary transition temperature of the copolymer of vinylidene fluoride and the melting temperature of the copolymer of vinylidene fluoride.

By subjecting the shaped bodies of the copolymer to the thermal treatment and to the polarization treatment, the polarized, shaped bodies of $k_t$ of larger than 0.21, preferably more than 0.22 and more preferably more than 0.23 are obtained.

The electromechanical coupling factor, herein mentioned, is defined by the formula:

$$k_t = \left( \frac{e_{33}^2}{C_{33}^D \cdot \epsilon_{33}^E} \right)^{\frac{1}{2}}$$

wherein $e_{33}$ is a piezoelectric stress constant, $C_{33}^D$ is an elastic constant under a constant electric displacement, $\epsilon_{33}^E$ is a dielectric constant under a constant strain, and the suffix means that z(3) axis has been chosen to be parallel to the direction of a stress or an electric field loaded onto the shaped body made of the copolymer in the direction parallel to the direction of polarization, and the value of $k_t$ has been obtained by analyzing the frequency characteristics of the electric admittance Y in the vicinity of the resonance point of the shaped body made of the copolymer while loading a high frequency voltage (at 1 to 50 MHz) onto the shaped body made of the copolymer according to the present invention and cut into a square shape of about 0.25 cm² in area (refer to J. Applied Physics, 47(3), 949–955 (1976)).

The crystalline secondary transition temperature, i.e. Curie Temperature $T_c°$ C., is defined by the temperature indicated by the peak or shoulder appearing in a differential thermal analytical curve obtained in the case where a specimen of the copolymer according to the present invention is subjected to differential thermal analysis at a velocity of temperature raising of 10° C./min, the peak or shoulder being the nearest one to the endothermic peak indicating the crystalline melting temperature of the copolymer ($T_m°$ C.) and being in the lower temperature side.

The value of $k_t$ of the polarized, shaped body according to the present invention is larger than the value of $k_t$ of the polarized, shaped body comprising the binary copolymer of vinylidene fluoride and trifluoroethylene, and in addition, the ultrasonic sensitivity of the ultrasonic transducer provided with the polarized, shaped body according to the present invention is improved in an extent higher than the improvement of the value of $k_t$. The difference between the above-mentioned two values of $k_t$ depends on the fact that the density of the binary copolymer becomes larger than the density of the copolymer after the thermal treatment or the polarization treatment. As a result, the acoustic impedance of the binary co-polymer becomes larger, and accordingly, the difference between the acoustic impedance and that of water becomes larger to reduce the sensitivity to sound waves. In addition, the copolymer according to the present invention is more pliable than the binary copolymer and excellent in close-adhesiveness to the base plate lined therewith for raising the sensitivity of the ultrasonic transducer, these properties being considered to be a reason why the terpolymer is superior to the binary copolymer in raising the sensitivity of the transducer.

Because of the merits, the polarized, shaped articles according to the present invention are particularly useful as the element of an ultrasonic transducer. Furthermore, the polarized, shaped body according to the present invention has several favorable properties known in the polarized, shaped body of poly(vinylidene fluoride) such as piezoelectricity of length expansion and pyroelectricity etc., and accordingly, is used in the same use field as the polarized, shaped bodies of poly(vinylidene fluoride).

The present invention will be explained more in detail while referring to the non-limitative examples as follows:

EXAMPLE 1

Into a stainless-steel autoclave provided with a stirrer, an aqueous solution of methylcellulose as a suspending agent was introduced, and after cooling the content of the autoclave to 5° C., n-propyl peroxydicarbonate as the polymerization initiator and other adjuvants for polymerization were added into the autoclave and after substituting the aerial space with gaseous nitrogen, the content of the autoclave was well stirred. Thereafter, the autoclave was cooled from outside by a mixture of dry-ice and methanol, and vinylidene fluoride, trifluoroethylene and vinyl fluoride were pressed into the autoclave from the respective pressure cylinders to prepare a monomeric mixture of a molar composition of 70:20:10 therein. Then the autoclave was heated to bring the inner temperature to 25° C., and the temperature was maintained until the inner pressure decreased to 8 kg/cm² from 36 kg/cm². After purging the residual monomer from the autoclave, the thus produced copolymer (terpolymer) was collected by filtration, washed well with water and dried to be a white powder in a yield of about 95%. The monomeric composition of the copolymer was substantially the same as that of the charged monomeric mixture, and the inherent viscosity ($\eta_{inh}$) was 0.92 dl/g (concentration of 0.4 g/liter in dimethylformamide at 25° C.). The white powder of the copolymer was subjected to casting with dimethylformamide as a solvent to obtain a cast film of about 30 micrometers in thickness.

The thus obtained, non-stretched film was processed into an electrode material by vacuum evaporation of aluminum after drying for one hour in air at 132° C., and a direct current voltage corresponding to an electric field strength of 650 KV/cm was applied onto the material at 85° C. for 30 min, and the material was cooled to the room temperature while applying the voltage to effect the polarization of the material. The piezoelectric constant $d_{31}$ of the thus prepared material of film form, measured by a Rheolograph ® (manufactured by Toyo Seiki Co., Ltd.) at 10 Hz was 11.2 pC/N.

In addition, since the film of the copolymer was treated by polarization treatment without having been stretched, $d_{31}$ equals to $d_{32}$ herein. The herein-mentioned piezoelectric constants $d_{31}$ and $d_{32}$ are defined as follows.

In the case of a polarized polymer film, the three axes, x, y and z are respectively decided so that x axis is taken in the stretching direction, y axis is taken to be perpendicular to x axis and z axis is taken to be perpendicular to the film surface, and then, the piezoelectric constant showing the polarization in the direction of z axis when a stress is loaded in the direction of x-axis is defined as $d_{31}$. The piezoelectric constant showing the polarization in the direction of z axis when the stress is loaded in the direction of y axis is defined as $d_{32}$. The constant showing the polarization in the direction of z-axis when the stress is loaded in the direction of z axis is defined as $d_{33}$.

The value of the electromechanical coupling factor, $k_t$ (along z axis—z axis) of the thus obtained piezoelectric film was obtained by analyzing the electric admittance of the piezoelectric film in the vicinity of free resonance point thereof and the dependency of the phase angle on the frequency to be 0.235.

According to the result of a repeating bend test to 180° on the piezoelectric material, no cutting was experienced even after more than 10 times of reciprocating bending, and as a result of measuring the elongation at break, the piezoelectric material showed 240% of elongation at break.

Figure 2:
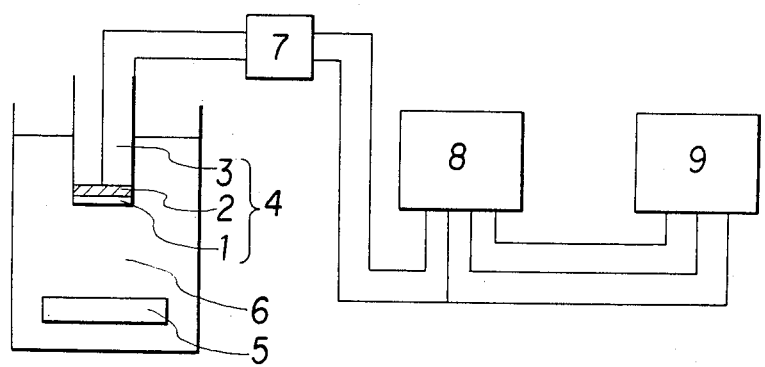
FIG. 2 shows a block diagram of a circuit for examining the ultrasonic sensitivity of the ultrasonic transducer by pulse-echo method.

The sensitivity in transmitting and receiving ultrasonic waves of an ultrasonic transducer provided with the thus prepared piezoelectric material of film form was measured by a circuit shown in FIG. 2 provided with an ultrasonic transducer having the longitudinal cross section shown in FIG. 1. The transducer 4 was constituted by adhering the piezoelectric material 1 under a pressure to the concave part (of a radius of carvature of 75 mm) at an end of a rod of Bakelite ® 3 via a copper plate 2 of a half length of the wave length in thickness while using an epoxy adhesive between 3 and 2, and between 2 and 1, the both sides of the transducer 4 having the respective electrodes of 10 mm in diameter. The ultrasonic transducer 4 was connected to a pulser-receiver 8 (type UTA-3, manufactured by KB-A EROTECH Co.) In FIG. 2, 6 is water; 5 is a plate of polymethylmethacrylate; 7 is a matching circuit and 9 is an oscilloscope.

The measurement was carried out according to pulse-echo method, and as a result of observing the voltage of pulse-echo while setting the receiver gain at 40 dB, the value of 38 V was obtained by peak to peak.

COMPARATIVE EXAMPLE 1

A cast film of about 30 micrometers in thickness obtained from a solution of a binary copolymer of 75 mol % of vinylidene fluoride and 25 mol % of trifluoroethylene produced by similar procedures of polymerization to those in Example 1 was subjected to the thermal treatment and polarization treatment under the same conditions as in Example 1. It showed the value of $k_t$ of 0.217 and the value of $d_{31}$ of 10.2 pC/N.

This film was cut by only one reciprocal bending, and showed no elongation at the room temperature by the test of elongation-at-break.

The sensitivity in transmitting and receiving ultrasonic wave of the thus prepared material was measured by the same apparatus shown in Example 1 to give the value of 28 V.

It should be added that in the case of preparing the ultrasonic transducer with the thus obtained material in the same manner as in Example 1, the material was fragile to give cracks in the product frequently resulting in a large loss of material.

For reference, the binary copolymer showed a value of $\eta_{inh}$ of 1.29 dl/g under the same conditions as in Example 1.

EXAMPLE 2

A cast film of about 30 micrometers in thickness obtained from a solution of a copolymer(terpolymer) of 75 mol % of vinylidene fluoride, 20 mol % of trifluoroethylene and 5 mol % of vinyl fluoride showing a $\theta_{inh}$ of 0.85 dl/g under the same conditions as in Example 1 produced by the similar procedures of polymerization to those in Example 1 was subjected to the thermal treatment and polarization treatment under the same conditions as in Example 1. It showed a value of $d_{31}$ of 10.5 pC/N and a value of $k_t$ of 0.228.

This film was cut after 5 times of reciprocal bending to 180°, however, no trouble was experienced in the preparation of the ultrasonic transducer therefrom.

The thus prepared element was applied to the same circuit as in Example 1 to measure the voltage by peak to peak of pulse echo giving the value of 35 V.

COMPARATIVE EXAMPLE 2

A cast film of about 30 micrometers in thickness obtained from a solution of a copolymer (terpolymer) of 70 mol % of vinylidene fluoride, 20 mol % of trifluoroethylene and 10 mol % of trifluoromonochloroethylene showing a $\eta_{inh}$ of 0.98 dl/g under the same conditions as in Example 1 produced by the similar procedures of polymerization to those in Example 2 was subjected to the thermal treatment and polarization treatment under the same conditions as in Example 1. The thus prepared material showed the value of $d_{31}$ of 0.8 pC/N and the value of $k_t$ of 0.11.

The measurement of the voltage by peak to peak of pulse-echo on the ultrasonic transducer provided with the element made of the thus prepared material gave a value of 8.2 V.

What is claimed is:

1. A polarized, shaped material comprising a copolymer of 40 to 87 mol % of vinylidene fluoride, 10 to 40 mol % of trifluoroethylene and 3 to 20 mol % of vinyl fluoride.

2. A polarized, shaped material according to claim 1, wherein said shaped material shows an electromechanical coupling factor ($k_t$) of larger than 0.21.

3. A polarized, shaped material according to claim 2, wherein said shaped material shows an electromechanical coupling factor ($k_t$) of larger than 0.22.

4. A polarized, shaped material according to claim 3, wherein said shaped material shows an electromechanical coupling factor ($k_t$) of larger than 0.23.

5. A polarized, shaped material according to claim 1, wherein said copolymer comprises 65 to 80 mol % of vinylidene fluoride, 15 to 30 mol % of trifluoroethylene and 5 to 15 mol % of vinyl fluoride.

6. A polarized, shaped material according to claim 1, wherein said copolymer is a terpolymer of vinylidene fluoride, trifluoroethylene and vinyl fluoride.

7. A polarized, shaped material according to claim 1, wherein said material additionally contains one or more fluorine containing monomers.

8. A polarized, shaped material according to claim 7, wherein said fluorine containing monomer is tetrafluoroethylene, hexafluoropropylene, or monochlorotrifluoroethylene.

* * * * *